(12) United States Patent  (10) Patent No.: US 7,807,340 B2
Breyta et al.  (45) Date of Patent: Oct. 5, 2010

(54) PHOTORESISTS FOR VISIBLE LIGHT IMAGING

(75) Inventors: Gregory Breyta, San Jose, CA (US); Daniel Joseph Dawson, San Jose, CA (US); Carl E. Larson, San Jose, CA (US); Gregory Michael Wallraff, Morgan Hill, CA (US)

(73) Assignee: International Business Machines Corporation, Armmonk, NY (US)

( * ) Notice: Subject to any disclaimer, the term of this patent is extended or adjusted under 35 U.S.C. 154(b) by 94 days.

(21) Appl. No.: 12/050,589

(22) Filed: Mar. 18, 2008

(65) Prior Publication Data

US 2008/0166669 A1    Jul. 10, 2008

Related U.S. Application Data

(62) Division of application No. 11/125,971, filed on May 9, 2005, now Pat. No. 7,354,692.

(51) Int. Cl.
    *G03F 7/26* (2006.01)
(52) U.S. Cl. ...................................................... 430/322
(58) Field of Classification Search .................. 430/322, 430/311
    See application file for complete search history.

(56) References Cited

U.S. PATENT DOCUMENTS

| | | |
|---|---|---|
| 4,655,969 A | 4/1987 | Richter et al. |
| 5,055,439 A | 10/1991 | Allen et al. |
| 5,240,795 A | 8/1993 | Yoshinaga et al. |

(Continued)

FOREIGN PATENT DOCUMENTS

EP    0628876 A1    5/1994

(Continued)

OTHER PUBLICATIONS

Palmer, "Diffraction Grating Handbook, 5th edition" Chap. 4, pp. 43-54, 2002.

*Primary Examiner*—Kathleen Duda
*Assistant Examiner*—Brittany Raymond
(74) *Attorney, Agent, or Firm*—Isaac M. Rutenberg; Bozicevic, Field & Francis LLP

(57) ABSTRACT

A method of creating patterned objects using a class of lithographic photoresist combinations is disclosed which is suitable for use with visible light and does not require a post-exposure bake step. The disclosed photoresists are preferably chemical amplification photoresists and contain a photosensitizer having the structure of formula (I):

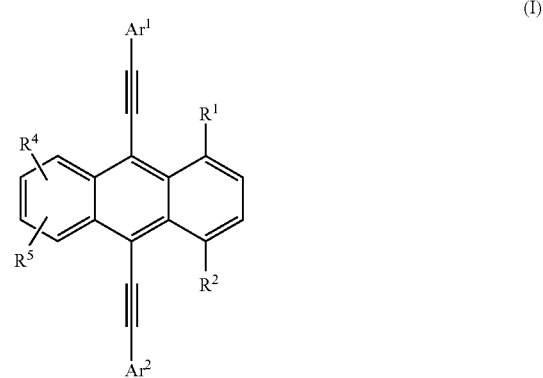

where $Ar^1$ and $Ar^2$ are independently selected from monocyclic aryl and monocyclic heteroaryl, $R^1$ and $R^2$ may be the same or different, and have the structure —X—$R^3$ where X is O or S and $R^3$ is $C_1$-$C_6$ hydrocarbyl or heteroatom-containing $C_1$-$C_6$ hydrocarbyl, and $R^4$ and $R^5$ are independently selected from the group consisting of hydrogen and —X—$R^3$, or, if ortho to each other, may be taken together to form a five- or six-membered aromatic ring, with the proviso that any heteroatom contained within $Ar^1$, $Ar^2$, or $R^3$ is O or S. The use of the disclosed photoresists, particularly for the manufacture of holographic diffraction gratings, is also disclosed.

25 Claims, 2 Drawing Sheets

U.S. PATENT DOCUMENTS

| | | |
|---|---|---|
| 5,272,042 A | 12/1993 | Allen et al. |
| 5,308,744 A | 5/1994 | Koes |
| 5,374,500 A * | 12/1994 | Carpenter et al. ........ 430/270.1 |
| 5,569,565 A | 10/1996 | Kawakami et al. |
| 5,712,078 A | 1/1998 | Huang et al. |
| 5,800,950 A | 9/1998 | Hirao et al. |
| 5,919,597 A | 7/1999 | Sinta et al. |
| 6,037,097 A | 3/2000 | Bucchignano et al. |
| 6,043,003 A | 3/2000 | Bucchignano et al. |
| 6,115,151 A | 9/2000 | Popovich |
| 6,342,334 B1 | 1/2002 | Yamana |
| 6,406,831 B1 | 6/2002 | Yamana |
| 6,489,065 B1 * | 12/2002 | Dhal et al. ..................... 430/2 |
| 6,555,288 B1 | 4/2003 | Xu et al. |
| 2003/0223102 A1 * | 12/2003 | Thor et al. .................... 359/15 |
| 2004/0214102 A1 | 10/2004 | DiPietro et al. |

FOREIGN PATENT DOCUMENTS

| | | |
|---|---|---|
| JP | 3014350 | 12/1999 |

* cited by examiner

PHOTORESISTS FOR VISIBLE LIGHT IMAGING

CROSS-REFERENCE TO RELATED APPLICATIONS

This is a divisional of U.S. Ser. No. 11/125,971, filed May 9, 2005, the disclosure of which is hereby incorporated by reference in its entirety.

TECHNICAL FIELD

This invention relates generally to the fields of polymer chemistry and lithography. More specifically, this invention relates to resists which are suitable for visible light imaging and which do not require post-exposure baking.

BACKGROUND OF THE INVENTION

Chemically amplified (CA) photoresists have achieved almost universal acceptance in the semiconductor industry whenever the highest levels of resist performance are required. The combination of high contrast, high photospeed, and good etch resistance make these materials extremely attractive for high resolution imaging at Deep UV (248 and 193 nm), VUV (157 nm) and EUV wavelengths (13.4 nm).

A typical CA photoresist contains a polymer which undergoes a reaction that results in increased or reduced solubility in a developer. The reaction is catalyzed by acid, which causes a change in an acid-labile moiety which affects solubility. For example, the reaction might make the polymer less lipophilic and/or more polar, or it might diminish cross-linking, or it might deprotect a group which provides solubility, for example an acid group which provides base solubility. As a consequence of the reaction and the resulting change in solubility, the areas exposed to light are removed or left behind in the development step. A typical CA photoresist also contains a radiation-sensitive acid generator system, consisting of one or more components which, upon exposure to radiation in a suitable wavelength range, undergo a reaction which produces an acid. The term "chemical amplification" refers to the fact that one molecule of acid produced by one photon can have an effect on a large number of polymer molecules.

Most CA photoresists require a postexposure bake step where the exposed resist and substrate are held at a temperature above ambient for a period of time. The temperatures achieved in the postexposure bake step serve to allow the reaction between the photogenerated moiety and polymers in the resist to go forward at an acceptable rate. Postexposure bakes tend to have certain disadvantages. For example, they require close control of contaminants and precise timing. For this reason, it has not been common to use CA photoresists outside the context of semiconductor microfabrication, in which close process control and a clean room environment are the norm.

A class of CA photoresists not necessarily requiring post-exposure bake, the ketal resist system (KRS) class, has been disclosed in a number of references detailed below, for example Japan Patent 3,014,350 (Kokai no. Heisei 9-112989). For resists of this class, the acid-labile moieties generally comprise ketal groups.

One application where CA photoresists have not been common is the production of surface holograms for use in the manufacture of diffraction gratings. Diffraction gratings are widely used optical elements which serve, for example, to separate light of different wavelengths with high resolution. Historically such gratings were made by mechanically ruling fine grooves in a suitable material, and even today mechanically ruled gratings continue to be used.

Since the 1960s, diffraction gratings have also been made using photolithography. To make a diffraction grating by photolithography, a layer of photoresist lying atop a substrate is dried and then exposed to a stationary interference fringe field. The fringe field has alternating areas of low and high illumination intensity. The photoresist is then developed so as to remove either the exposed or unexposed regions. The substrate with attached photoresist may then be coated, and may be used directly as a grating or as a master to manufacture additional gratings. For example, the substrate can be etched so that areas that are not protected by photoresist are selectively removed. The resulting etched substrate may be used as a diffraction grating or used as a master to manufacture additional gratings. For more information regarding the use of photolithography to manufacture diffraction gratings, see Christopher Palmer, *Diffraction Grating Handbook* (5th ed., Thermo RGL 2002), especially pages 43-54.

In making holographic diffraction gratings, certain characteristics common to other photoresist applications are desired. For example, considerable value is attached to a relatively sensitive photoresist requiring comparatively short exposures. Such short exposures are desirable, for example, for reasons of throughput.

There are also some differences between the use of photoresist for semiconductor fabrication and for making holographic diffraction gratings. For example, masks and projection optics are not used to make diffraction gratings because the desired exposure pattern can be generated directly by optical means as an interference pattern (a process referred to as "direct write imaging"). Also, diffraction gratings may be substantially larger than even the largest commonly used semiconductor wafers (300 mm~1 foot in diameter at the present time).

Furthermore, holographic diffraction gratings are often made with near-ultraviolet light, and it is desired to employ visible light to make such gratings. The use of near-ultraviolet and visible light for holographic diffraction gratings would be in contrast to the general use of ultraviolet light in semiconductor fabrication at the present time.

In light of these differences between semiconductor manufacturing and the manufacture of diffraction gratings, a CA photoresist to be used in the manufacture of diffraction gratings would ideally have the following two characteristics. First, it would have sufficient absorbance in the visible wavelengths commonly used to make such gratings. Second, it would not require post-exposure bake.

SUMMARY OF THE INVENTION

In an embodiment of this invention, there is provided a photoresist system comprising an acid generator that generates photoacid, a photosensitizer that absorbs in the wavelength range of visible light to an extent that it facilitates generation of the photoacid from the acid generator upon exposure to visible light, and a polymer having acid-labile groups and being suitable for use in a photolithographic process that does not require a post-exposure bake. The acid generator may itself be radiation-sensitive. As explained in more detail below, it is preferred in this embodiment that the photoresist in general belong to the KRS class, that the acid generator be a diaryl iodonium salt, and that the photosensitizer be a substituted 9,10-diethynylanthracene. It is particularly preferred that the 9,10-diethynylanthracene photosensitizer have alkoxy substituents at positions 1 and 4.

In a further embodiment of this invention, there is provided a method for creating a patterned object. The method comprises coating a substrate with a chemical amplification photoresist, exposing the photoresist to visible light, and then, without a post-exposure bake step, developing the photoresist. As explained in more detail below, when the patterned object is a holographic diffraction grating, the visible light would normally be a static interference pattern, produced with a laser. In that event, the patterned photoresist may be coated with metal and used as a master for the creation of diffraction gratings. Alternatively the substrate may be etched, creating in it a pattern according to the areas where photoresist is removed in the development process, and that patterned substrate may be used as a master for creating diffraction gratings. A photoresist of the KRS class is preferred, as is quasimonochromatic light of a wavelength of approximately 532 nm.

In a further embodiment of this invention, there is provided a lithographic photoresist composition containing a polymeric binder and a sensitizer having the structure of formula (I) given below.

DETAILED DESCRIPTION OF THE INVENTION

Figure 1:
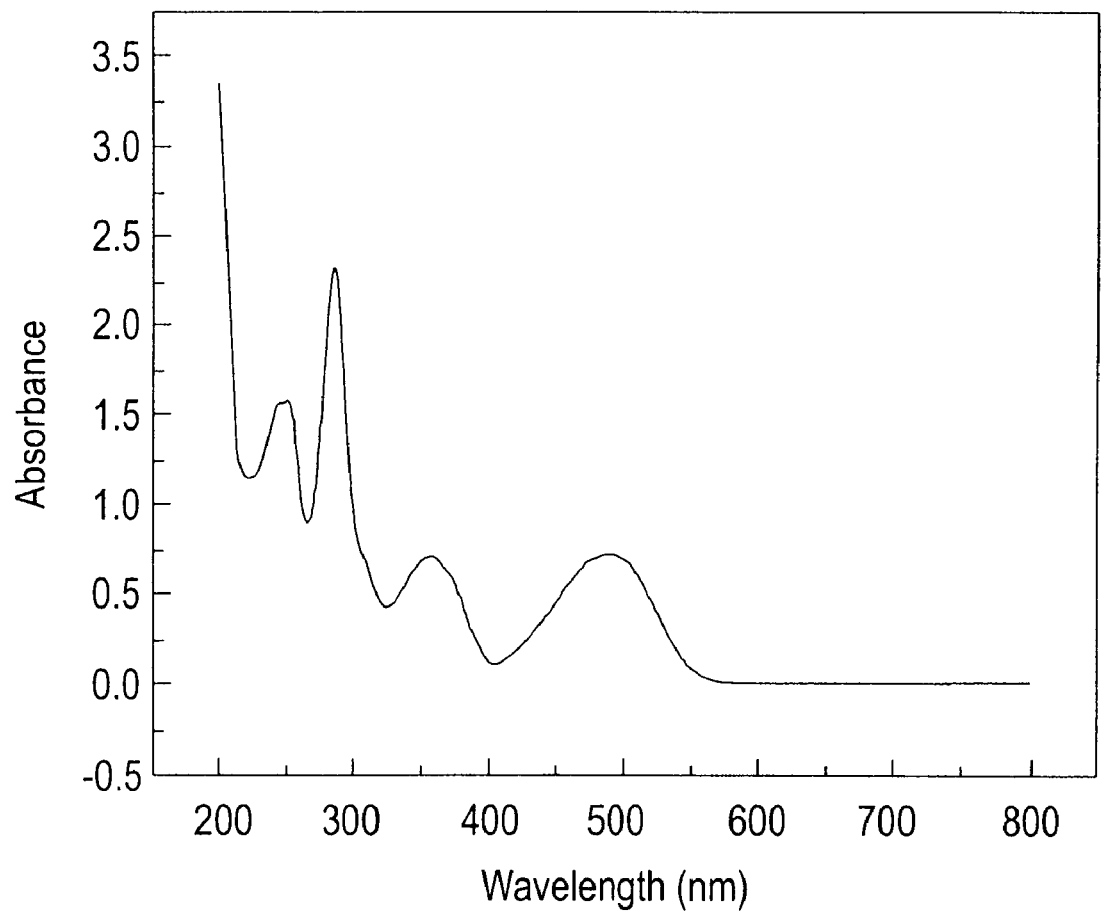
FIG. 1 depicts the absorbance of a preferred sensitizer 1,4-diethoxy-9,10-bisphenylethynylanthracene in the wavelength range of 200 to 800 nm.

Unless otherwise indicated, this invention is not limited to specific compositions, components, or process steps. It should also be noted that the singular forms "a" and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a linear or branched, saturated hydrocarbon substituent such as methyl, ethyl, n-propyl, isopropyl, n-butyl, isobutyl, sec-butyl, t-butyl, octyl, decyl, tetradecyl, hexadecyl, eicosyl, tetracosyl, and the like. Generally alkyl groups herein contain 1 to about 12 carbon atoms, preferably 1 to about 6 carbon atoms, and optimally 1 or 2 carbon atoms. The term "substituted alkyl" refers to alkyl substituted with one or more substituent groups, i.e., wherein a hydrogen atom is replaced with a non-hydrogen substituent group. The terms "heteroatom-containing alkyl" and "heteroalkyl" refer to alkyl substituents in which at least one carbon atom is replaced with a heteroatom such as O, N, or S. If not otherwise indicated, the term "alkyl" includes linear, branched, cyclic, unsubstituted, and/or substituted alkyl.

The term "aryl" as used herein, and unless otherwise specified, refers to an aromatic substituent containing a single aromatic ring or multiple aromatic rings that are fused together, directly linked, or indirectly linked (such that the different aromatic rings are bound to a common group such as a methylene or ethylene moiety). Preferred aryl groups contain either one aromatic ring or two to four fused aromatic rings, e.g., phenyl, naphthyl, and the like, with more preferred aryl groups being noncyclic and containing one aromatic ring. "Substituted aryl" refers to an aryl moiety substituted with one or more substituent groups, and the terms "heteroatom-containing aryl" and "heteroaryl" refer to an aryl group in which at least one ring carbon atom is replaced with a heteroatom. If not otherwise indicated, the term "aryl" includes linear, branched, cyclic, unsubstituted, and/or substituted aryl.

By "substituted" as in "substituted alkyl," "substituted aryl," and the like, as alluded to in some of the aforementioned definitions, is meant that in the alkyl, aryl, or other moiety, at least one hydrogen atom bound to a carbon (or other) atom is replaced with a non-hydrogen substituent. Examples of such substituents include, without limitation, functional groups such as halide, hydroxyl, alkoxy, acyl (including alkylcarbonyl (—CO-alkyl) and arylcarbonyl (—CO-aryl)), acyloxy (—O-acyl), alkoxycarbonyl (—(CO)—O-alkyl), aryloxycarbonyl (—(CO)—O-aryl), and silyl (e.g., trialkylsilyl), and hydrocarbyl moieties such as alkyl, aryl, aralkyl(aryl-substituted alkyl), and alkaryl(alkyl-substituted aryl). The aforementioned functional groups may, if a particular group permits, be further substituted with one or more additional functional groups or with one or more hydrocarbyl moieties such as those specifically enumerated above, and analogously, the above-mentioned hydrocarbyl moieties may be further substituted with one or more functional groups or additional hydrocarbyl moieties such as those specifically enumerated.

The term "hydrocarbyl" is used in its conventional sense to refer to a hydrocarbon group containing carbon and hydrogen, and may be aliphatic, alicyclic or aromatic, or may contain a combination of aliphatic, alicyclic and/or aromatic moieties.

The term "polymer" is used to refer to a chemical compound that comprises linked monomers, and that may be linear, branched, hyperbranched, or crosslinked. The term also encompasses not only homopolymers, but also copolymers, terpolymers, and the like. The term "copolymer," unless specifically indicated otherwise, refers to a polymer containing at least two different monomer units (thus encompassing, for example, terpolymers).

When a functional group is termed "protected," this means that the group is in modified form to preclude undesired side reactions at the protected site. Suitable protecting groups for the compounds of the present invention will be recognized from the present application taking into account the level of skill in the art, and with reference to standard textbooks, such as Greene et al., *Protective Groups in Organic Synthesis* (New York: Wiley, 1991).

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The term "acid-labile moiety" refers to a molecular segment containing at least one bond that is cleaved upon exposure to acid.

The terms "photogenerated acid" and "photoacid" are used interchangeably herein to refer to the acid that is created upon exposure of the present compositions to radiation, i.e., as a result of the acid generator in the compositions.

For additional information concerning terms used in the field of lithography and lithographic compositions, see *Introduction to Microlithography*, Eds. Thompson et al. (Washington, D.C.: American Chemical Society, 1994).

A CA photoresist for visible light direct write imaging with an Ar ion laser is described in U.S. Pat. No. 5,055,439. That photoresist is based on a substituted bisphenylethynyl-anthracene sensitizer and a conventional acrylic photoresist. This material has been found to be unsuitable for holographic imaging at 514 nm in graphics arts applications, primarily due to the requirements for contamination control and carefully controlled post expose bake steps.

As stated above, the CA photoresists of the invention include in general a photoacid generator and a polymer with an acid-labile group, as well as a suitable solvent.

Preferred examples of photoacid generators for use in the present invention comprise a sensitizer and an acid generator. The sensitizer must have adequate absorbance in the appropriate range of light being used to expose the photoresist. Particularly preferred sensitizers are substituted anthracenes of the general formula:

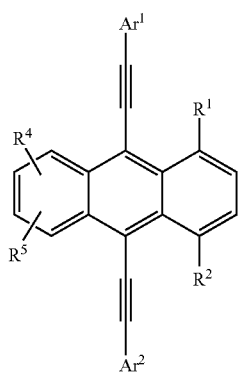

(I)

where $Ar^1$ and $Ar^2$ are independently selected from monocyclic aryl and monocyclic heteroaryl, $R^1$ and $R^2$ may be the same or different, and have the structure —X—$R^3$ where X is O or S and $R^3$ is $C_1$-$C_6$ hydrocarbyl or heteroatom-containing $C_1$-$C_6$ hydrocarbyl, and $R^4$ and $R^5$ are independently selected from the group consisting of hydrogen and —X—$R^3$, or, if ortho to each other, may be taken together to form a five- or six-membered aromatic ring, with the proviso that any heteroatom contained within $Ar^1$, $Ar^2$, or $R^3$ is O or S. When two or more of $R^1$, $R^2$, $R^4$, or $R^5$ have a structure —X—$R^3$, the X and $R^3$ may be chosen independently for each of $R^1$, $R^2$, $R^4$, or $R^5$, so that, for example, $R^1$ could be —O—$CH_3$ and $R^2$ could be —S—$CH_2CH_3$.

The particular choice of photosensitizer is dependent on the precise wavelength of the light to be used in the particular photolithographic process at issue. Considerations in choosing a wavelength include the availability and cost of lasers and other optical elements suitable for operating at that wavelength. A wavelength whose use is desirable for diffraction gratings is 532 nm, which is ½ the fundamental wavelength of a commonly used Nd:YAG solid state laser. Other useful wavelengths readily achieved with common lasers include 472.7, 476.5, 488, 496.5, 501.7, 514.5, and 528.7 nm (Ar ion), 510 and 578 nm (copper vapor), 431 and 531 nm (Kr ion), and 523 nm (doubled Nd-YAG). CW dye lasers are also usable and achieve frequencies between 370 and 1000 nm.

A particularly preferred example of a photosensitizer for visible light in a range around 532 nm is 1,4-diethoxy-9,10-bisphenylethynylanthracene, whose measured absorption spectrum is depicted in FIG. 1. It is seen that 1,4-diethoxy-9,10-bisphenylethynylanthracene has absorbance at 532 nm sufficient to render it suitable as a photosensitizer when used in the photoresists of the invention at that wavelength.

Acid generators for photoresist compositions in general are compounds that, upon exposure to radiation, generate a strong acid (a "photoacid") and are compatible with the other components of the photoresist composition. A number of acid generators are disclosed in U.S. Patent Application Publication No. 2004/0214102. In particular, onium salts are commonly used acid generators. Onium salts that contain weakly nucleophilic anions are in particular usable as acid generators. Examples of such anions are the halogen complex anions of divalent to heptavalent metals or non-metals, for example, Sb, B, P, and As. Examples of suitable onium salts are aryl diazonium salts, halonium salts, aromatic sulfonium salts and sulfoxonium salts or selenium salts (e.g., triarylsulfonium and diaryliodonium hexafluoroantimonates, hexafluoroarsenates, trifluoromethanesulfonates and others). Preferred examples of acid generators for use in the present invention include those which are relatively easily reduced. Examples of these are acid generators consisting of diaryliodonium salts, for example hexafluoroantimonates, hexafluoroarsenates, trifluoromethanesulfonates, specifically, for example, diphenyliodonium hexafluorantimonate, diphenyliodonium triflate, methoxydiphenyliodonium triflate, diphenyliodonium hexafluoro-phosphate, diphenyliodonium nitrate, diphenyliodonium perfluoro-1-butanesulfonate, and diphenyliodoniump-toluenesulfonate, as well as mixtures of such acid generators. Among these, a particularly preferred example is bis-(4-tert-butylphenyl) iodonium triflate.

The polymers of the photoresists of the invention, as indicated above, include acid-labile moieties. In one embodiment the liability of the acid-labile moieties is dependent on a co-reactant not found in the film. In one embodiment, the co-reactant is moisture (water). In one embodiment the labile moiety is cleavable in the presence of acid and co-reactant without the need for the application of thermal energy.

The polymer matrix of the photoresist of the invention may be a homopolymer, copolymer, terpolymer or a polymer consisting of four or more differing monomeric repeat units. The polymers comprising more than one type of monomer (copolymer, terpolymer, etc.) are referred to simply as copolymers for simplicity but with the understanding that the polymeric entity may comprise more than two monomer types. The polymers preferably have a molecular weight of about 1000 to about 50,000 Daltons and a polydispersity in the range of about 1 to about 5. Suitable polymers include poly (hydroxystyrene), poly(vinylbenzoic acid), poly(acrylic acid), poly(methacrylic acid), poly(norbornenecarboxylic acid), poly[5-(1,1,1,3,3,3-hexafluoromethyl-2-hydroxypropyl)norbornene], poly(hydroxyperfluorostyrene), and derivatives and copolymers thereof. The most preferred polymers are polymers and copolymers of poly(4-hydroxystyrene).

Preferred examples of polymers with acid-labile moieties for use in the photoresist of the invention include those classified as having low activation energy protecting groups. Among these the most preferable are those that require a co-reactant for deprotection. Among the most preferable of these are acetals and ketals that require an approximately stoichiometric amount of water to afford room temperature cleavage as in U.S. Pat. No. 5,712,078 by Huang et al. Also, Brunsvold et al. disclose a ketal resist system or KRS in Japan Patent 3,014,350 (Kokai no. Heisei 9-112989). Preferred examples of acetal and ketal protecting groups can be found in the aforementioned references by Huang and Brunsvold, references cited therein, and include but are not limited to methoxypropyl, methoxycyclohexyl, benzyloxypropyl, and derivatives and analogs thereof. The preferred level of the protecting group is between 1 and 100% and more preferably between 10 and 40%. Preparation of such a polymer is taught by Brunsvold et al. in U.S. Pat. No. 5,919,597 and in Bucchignano et al., U.S. Pat. No. 6,037,097. A preferred example of an acid-labile polymer is thus poly(hydroxystyrene) having a molecular weight in the range of about 2000 to about 10,000 Daltons with 20-30% protection of methoxycyclohexyl ketal as disclosed by Bucchignano et al. in U.S. Pat. No. 6,043,003.

A particularly preferred photoresist, referred to as "formulation A," comprises the following components: (a) 12.1 grams 30% solution of 40% methoxycyclohexyl protected poly(hydroxystyrene), (b) 15 grams cyclohexanone as solvent, (c) 415 mg bis-(4-tert-butylphenyl)-iodonium triflate, (d) 320 mg 1,4-diethoxy-9,10-bisphenylethynylanthracene, and (e) 20 mg bis-(tert-butylphenyl)iodonium dichloroacetate (basic acid control agent). The basic acid control agent serves to limit diffusion of the photoacid. An alternative preferred solvent is propylene glycol monomethyl acetate.

As stated above, the invention also encompasses a method for the manufacture of a holographic diffraction grating using a CA photoresist which does not require a postexposure bake step. In general such manufacture includes at least the following steps. A photoresist is coated on a substrate and then baked in order to remove the solvent, leaving a solid film. It is generally desired that the coated photoresist be substantially uniform. The substrate may be either planar or concave or of other shapes. The baking is commonly done on a hotplate. The temperature should be sufficiently high to remove the bulk of the solvent but without causing undesired reactions in the photoresist.

The photoresist and substrate are then exposed to a static interference pattern. Such a pattern may result, for example, from an interferometric arrangement in which a beam of light, typically from a laser, is split in two, and each of the two beams is then focused on the surface of the photoresist. On that surface the two beams form a static interference pattern.

The static interference pattern may be linear, that is to say, consisting of a set of alternating light and dark areas where the points of maximum and minimum light intensity lie on straight lines. The static interference pattern may also have other geometries, for example where the substrate is curved (concave gratings), or where the pattern results from the interference of spherical wavefronts, allowing the surfaces of maximum intensity to be hyperboloids or ellipsoids.

It is common for the exposure step of the process of making holographic gratings to employ optical components of high quality in a specially constructed facility. Factors which may affect the static interference patterns, such as ambient light, vibration, air movement, and stray light resulting, for example, from reflections within the optical system, may need to be controlled or minimized. It is possible, particularly for larger substrates, that the static interference pattern may be scanned across the surface of the substrate.

Following the exposure step, it is common to perform a post-exposure bake which raises the temperature of the photoresist in order to allow the reactions catalyzed by the photogenerated acid to have the desired effect of making the photoresist more soluble in the developer. Where there is a post-exposure bake step there can also occur undesirable side reactions, for example, neutralization of the photogenerated acid at the upper surface of the photoresist if the air contains alkaline contamination, resulting in a diminished deprotection effect and continued low solubility of the polymer in a thin layer near the upper surface. Such neutralization can hinder development and degrade resist profiles. As has been noted above, in certain embodiments of the present invention, preferably no post-exposure bake is performed, and the photoresist and substrate are instead kept at or around ambient temperature between exposure and development.

If a photoresist is used in which a deprotection reaction-dependent co-reactant is needed prior to the development process, it is then necessary to bring the photoresist into contact with this coreactant in order to allow the deprotection reactions to proceed to the necessary degree to permit successful development. This step may involve exposure to an ambient of adequate relative humidity if the coreactant is water.

The development of the photoresist can in general be carried out in a variety of known developers, some of which are commercially marketed. A preferred developer is an aqueous solution of tetramethylammonium hydroxide (TMAH). A preferred concentration of the aqueous TMAH solution is between 0.05 and 0.4 N (normal). A more preferred concentration is between 0.13 and 0.27 N. In one embodiment the developer solution contains a surfactant.

Following development, it is common to coat the patterned photoresist coated substrate with metal for use either as a reflective grating or as a master for the manufacture of further diffraction gratings. Alternatively, the substrate may be etched by means of well known techniques, e.g., ion beam etching, to produce a pattern in the substrate which tracks that exposed in the photoresist. The photoresist may then be removed and the substrate used as a diffraction grating directly or as a master for the manufacture of further diffraction gratings.

While the manufacture of holographic diffraction gratings has served as a motivation for the development of the novel photoresists disclosed here, it should be understood that these photoresists may have other applications where the characteristics which they possess are desirable for the particular application at hand.

It is to be understood that while the invention has been described in conjunction with the preferred specific embodiments thereof, the foregoing description as well as the examples that follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

Unless otherwise indicated, all reagents were obtained commercially or synthesized according to known methods.

EXAMPLE 1

Synthesis of 1,4-Diethoxyanthraquinone (1,4-DEAQ)

A mixture of quinizarin (20.0 g, 83.5 mmol), potassium carbonate (76 g, 550 mmol) and ethyl sulfate (38.6 g, 250 mmol) was refluxed in methyl ethyl ketone (MEK, 950 mL) for 24 hrs. The reaction was filtered hot through Celite using additional hot MEK. The solution was evaporated on a rotary evaporator until crystallization began, then the reaction was allowed to sit overnight. After cooling in an ice bath, the crystals were filtered, rinsed with $Et_2O$, sucked dry, then dried overnight in a vacuum oven at 70° C. The yield was 14.0 g (57%) of yellow/orange crystals.

EXAMPLE 2

Synthesis of 1,4-Diethoxy-9,10-phenylethynylanthracene 1,4-DEAQ (14.0 g, 47.2 mmol) was added portionwise to lithium phenylacetylide (1.0M in THF, 146 mL, 146 mmol) in a 500 ml round bottomed flask under nitrogen atmosphere. A slight exotherm to about 38° C. occurred. Mixture was heated to 50° C. for 1 hour. Dry dimethylformamide (DMF, 45 mL) was added, causing a slight exotherm at the beginning of the addition. Heating was continued 4 more hours, then the reaction was cooled in ice bath and $SnCl_2$—$H_2O$ (28.8 g) dissolved in dry DMF (57 mL) added. Cooling was removed and the reaction stirred at room temperature overnight.

The next day acetic acid (8.6 g) and 8N $H_2SO_4$ (57.3 mL) were added dropwise to the mixture. The mixture was refrigerated and the precipitate filtered and rinsed with cold methanol. The orange crystals were dried in a vacuum oven overnight at 60° C. (mp 160-164° C.).

EXAMPLE 3

Use of Photoresist to Make a Grating

Figure 2:
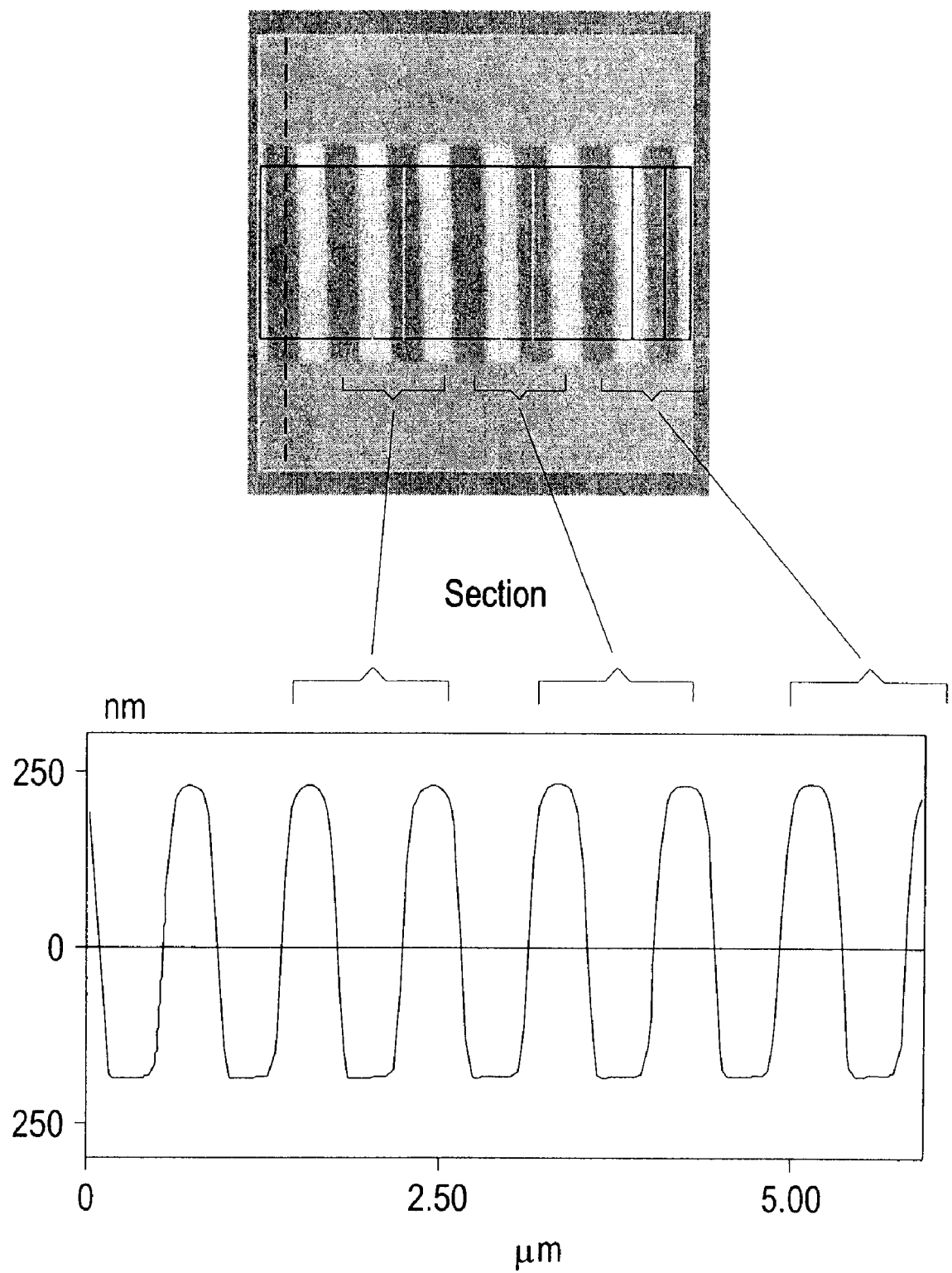
FIG. 2 depicts the atomic force microscopy trace of the grating pattern in the resist of Example 3.

The particularly preferred resist formulation A described above was employed, coated at an initial thickness of ~500 nm. The resist coated substrates were soft baked in the oven at 100° C. prior to exposure. No ARC was employed on the 20 cm thick quartz substrates coated with black absorber material on the back surface. The oven was heated up to 100° C. without the parts in it. Once the oven reached temperature, the samples were put in the oven for 30 min, then removed and cooled outside the oven. The exposure dose was 18 mJ/cm² at 532 nm. Standard CD-26 development was employed. FIG. 2 shows the atomic force microscopy (AFM) trace of the grating pattern in the resist.

We claim:
1. A method of creating a patterned object using visible light, the method comprising:
    (a) coating a substrate with a chemical amplification photoresist suitable for use in the visible light wavelength range,
    (b) exposing the photoresist to visible light, and
    (c) developing the exposed photoresist, thereby creating a photoresist pattern on the substrate, wherein the photoresist is maintained at or around ambient temperature from the time that it is exposed through the time that it is developed,
wherein the chemical amplification photoresist is a lithographic photoresist composition comprising a photosensitizer having the structure of formula (I):

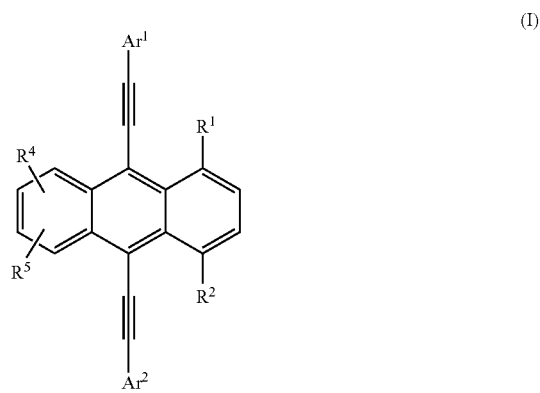

wherein:
    $Ar^1$ and $Ar^2$ are independently selected from monocyclic aryl and monocyclic heteroaryl,
    $R^1$ and $R^2$ may be the same or different, and have the structure —X—$R^3$ where X is O or S and $R^3$ is $C_1$-$C_6$ hydrocarbyl or heteroatom-containing $C_1$-$C_6$ hydrocarbyl, and
    $R^4$ and $R^5$ are independently selected from the group consisting of hydrogen and —X—$R^3$, or, if ortho to each other, may be taken together to form a five- or six-membered aromatic ring,
    with the proviso that any heteroatom contained within $Ar^1$, $Ar^2$, or $R^3$ is O or S.

2. The method of claim 1, wherein the visible light has the form of a static interference fringe field.

3. The method of claim 1, wherein the patterned object is a diffraction grating.

4. The method of claim 3, wherein the patterned object is a concave diffraction grating.

5. The method of claim 1, wherein the visible light has spectral content primarily in the wavelength range above about 515 nm.

6. The method of claim 5, wherein the visible light has spectral content primarily in the range of about 525 nm to about 550 nm.

7. The method of claim 6, wherein the visible light comprises quasimonochromatic light of a wavelength of approximately 532 nm.

8. The method of claim 1, further comprising depositing a metal layer on the patterned photoresist to form a metallized pattern.

9. The method of claim 8, further comprising using the metallized pattern as a master for making a diffraction grating.

10. The method of claim 1, wherein the lithographic photoresist composition further comprises:
    (a) an acid generator that generates a photoacid; and
    (c) a polymer having acid-labile moieties;
wherein the lithographic photoresist composition is suitable for use in a photolithographic process that does not require a post-exposure bake, and wherein the photosensitizer absorbs in the wavelength range of visible light to an extent that it facilitates generation of the photoacid from the acid generator upon exposure to visible light.

11. The method of claim 10, wherein R¹ and R² are the same.

12. The method of claim 10, wherein Ar¹ and Ar² are the same, and are monocyclic aryl.

13. The method of claim 10, wherein R⁴ and R⁵ are hydrogen.

14. The method of claim 10, wherein R⁴ and R⁵ are ortho to each other and are taken together to form a five- or six-membered aromatic ring.

15. The method of claim 10, wherein R¹ and R² are the same, X is O, R³ is methyl or ethyl, Ar¹ and Ar² are phenyl, and R⁴ and R⁵ are hydrogen.

16. The method of claim 10, wherein the acid generator comprises an iodonium salt.

17. The method of claim 10, wherein the polymer is a copolymer of poly(4-hydroxystyrene).

18. The method of claim 10, wherein the lability of the acid-labile moieties is dependent on a co-reactant not found in the photoresist composition.

19. The method of claim 10, further comprising a photoresist casting solvent and a basic acid control agent.

20. The method of claim 1, wherein the visible light has the form of a static interference fringe field.

21. The method of claim 1, further comprising etching the substrate to create a pattern therein.

22. The method of claim 21, wherein the patterned substrate is used as a master for creating diffraction gratings.

23. A method of creating a pattern on a substrate using visible light, the method comprising:
  (a) coating the substrate with a chemical amplification photoresist suitable for use in the visible light wavelength range,
  (b) exposing the photoresist to visible light, and
  (c) without performing a post-exposure bake of the substrate and photoresist, developing the exposed photoresist, thereby creating a photoresist pattern on the substrate,
  wherein the chemical amplification photoresist is a lithographic photoresist composition comprising a photosensitizer having the structure of formula (I):

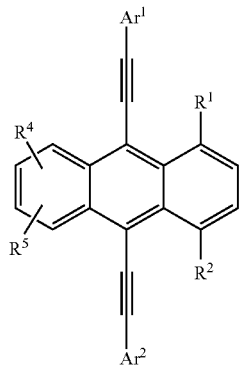

wherein:
  Ar¹ and Ar² are independently selected from monocyclic aryl and monocyclic heteroaryl,
  R¹ and R² may be the same or different, and have the structure —X—R³ where X is O or S and R³ is C₁-C₆ hydrocarbyl or heteroatom-containing C₁-C₆ hydrocarbyl, and
  R⁴ and R⁵ are independently selected from the group consisting of hydrogen and —X—R³, or, if ortho to each other, may be taken together to form a five- or six-membered aromatic ring,
  with the proviso that any heteroatom contained within Ar¹, Ar², or R³ is O or S.

24. The method of claim 23, wherein the lithographic photoresist composition further comprises:
  (a) an acid generator that generates a photoacid; and
  (c) a polymer having acid-labile moieties;
  wherein the lithographic photoresist composition is suitable for use in a photolithographic process that does not require a post-exposure bake, and wherein the photosensitizer absorbs in the wavelength range of visible light to an extent that it facilitates generation of the photoacid from the acid generator upon exposure to visible light.

25. The method of claim 24, wherein R⁴ and R⁵ are hydrogen.

* * * * *